(12) United States Patent
Dinger

(10) Patent No.: US 6,353,470 B1
(45) Date of Patent: Mar. 5, 2002

(54) MICROLITHOGRAPHY REDUCTION OBJECTIVE AND PROJECTION EXPOSURE APPARATUS

(76) Inventor: Udo Dinger, Heinz-Küppenbender-Strasse 4, 73447 Oberkochen (DE)

( * ) Notice: Subject to any disclaimer, the term of this patent is extended or adjusted under 35 U.S.C. 154(b) by 0 days.

(21) Appl. No.: 09/503,640

(22) Filed: Feb. 14, 2000

(30) Foreign Application Priority Data

Feb. 15, 1999 (DE) ......................................... 199 06 001
Oct. 7, 1999 (DE) ......................................... 199 48 240

(51) Int. Cl.$^7$ ...................... G03B 27/72; G03B 27/54; G02B 5/10
(52) U.S. Cl. .............................. 355/71; 355/67; 359/859
(58) Field of Search .............................. 355/53, 67, 54, 355/77, 55; 359/365, 859, 631, 686; 250/492.2

(56) References Cited

U.S. PATENT DOCUMENTS

| 5,272,568 A | * 12/1993 | Dejager | .................. 359/758 |
|---|---|---|---|
| 5,686,728 A | 11/1997 | Shafer | .................. 250/492.2 |
| 5,815,310 A | * 9/1998 | Williamson | .................. 359/365 |

FOREIGN PATENT DOCUMENTS

EP  0 779 528 A2  6/1997

* cited by examiner

*Primary Examiner*—Russell Adams
*Assistant Examiner*—Hung Henry Nguyen
(74) *Attorney, Agent, or Firm*—Marshall, Gerstein, & Borun

(57) ABSTRACT

The invention concerns a microlithography projection objective device for short wavelengths, preferably <100 nm with a first (S1), a second mirror (S2), a third (S3), a fourth mirror (S4), a fifth (S5) and a sixth mirror (S6). The invention is characterized by the fact that the image-side numerical aperture is NA≧0.15 and that the mirror nearest to the object to be illuminated, preferably nearest to the wafer, is arranged in such a way that the image-side optical free working distance corresponds at least to the used diameter D of this mirror nearest to the wafer and/or the image-side optical free working distance is at least the sum of a third of the used diameter D of this mirror and a length which lies between 20 mm and 30 mm, and/or the image-side optical free working distance is at least 50 mm, preferably 60 mm.

39 Claims, 5 Drawing Sheets

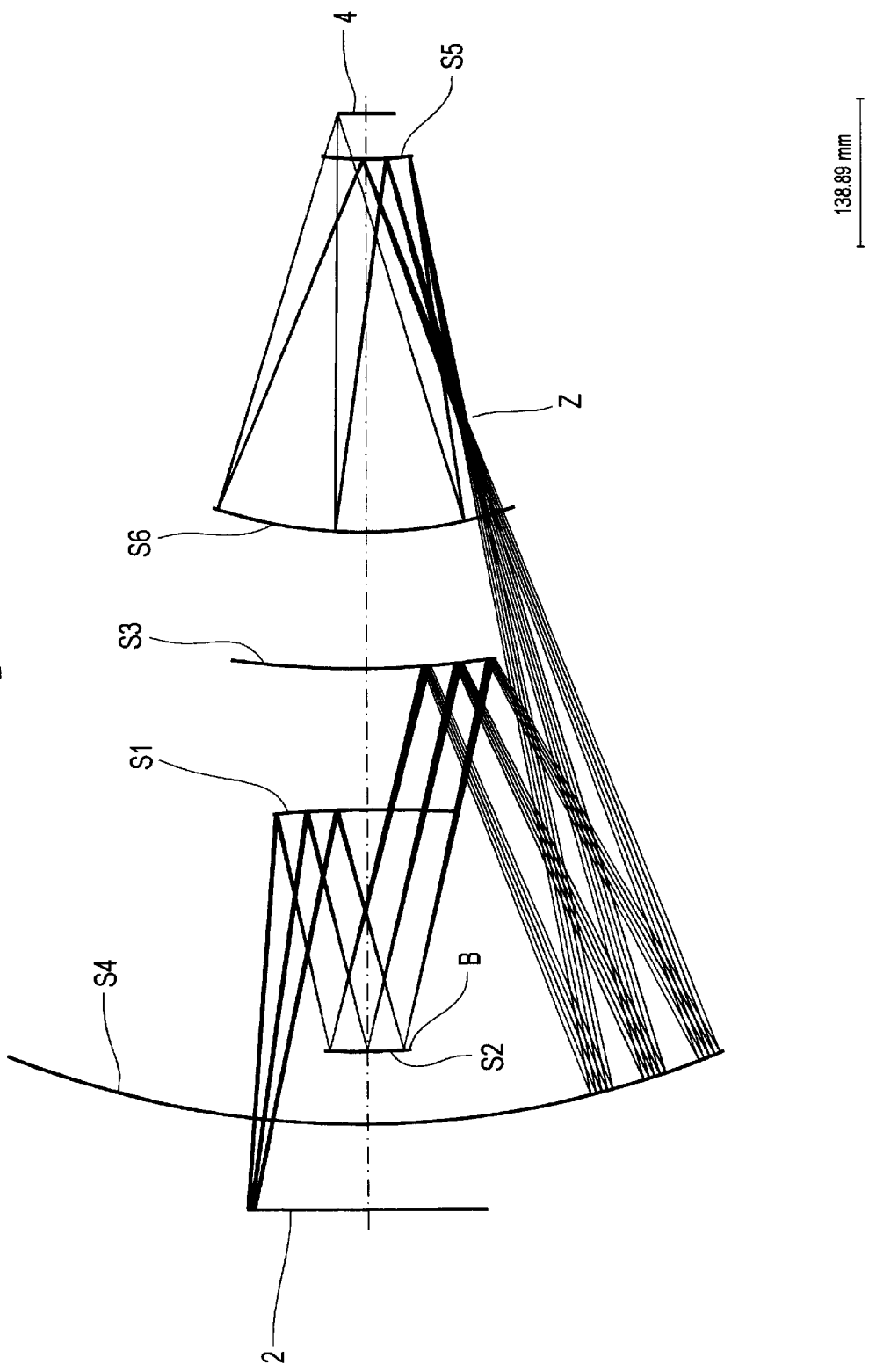

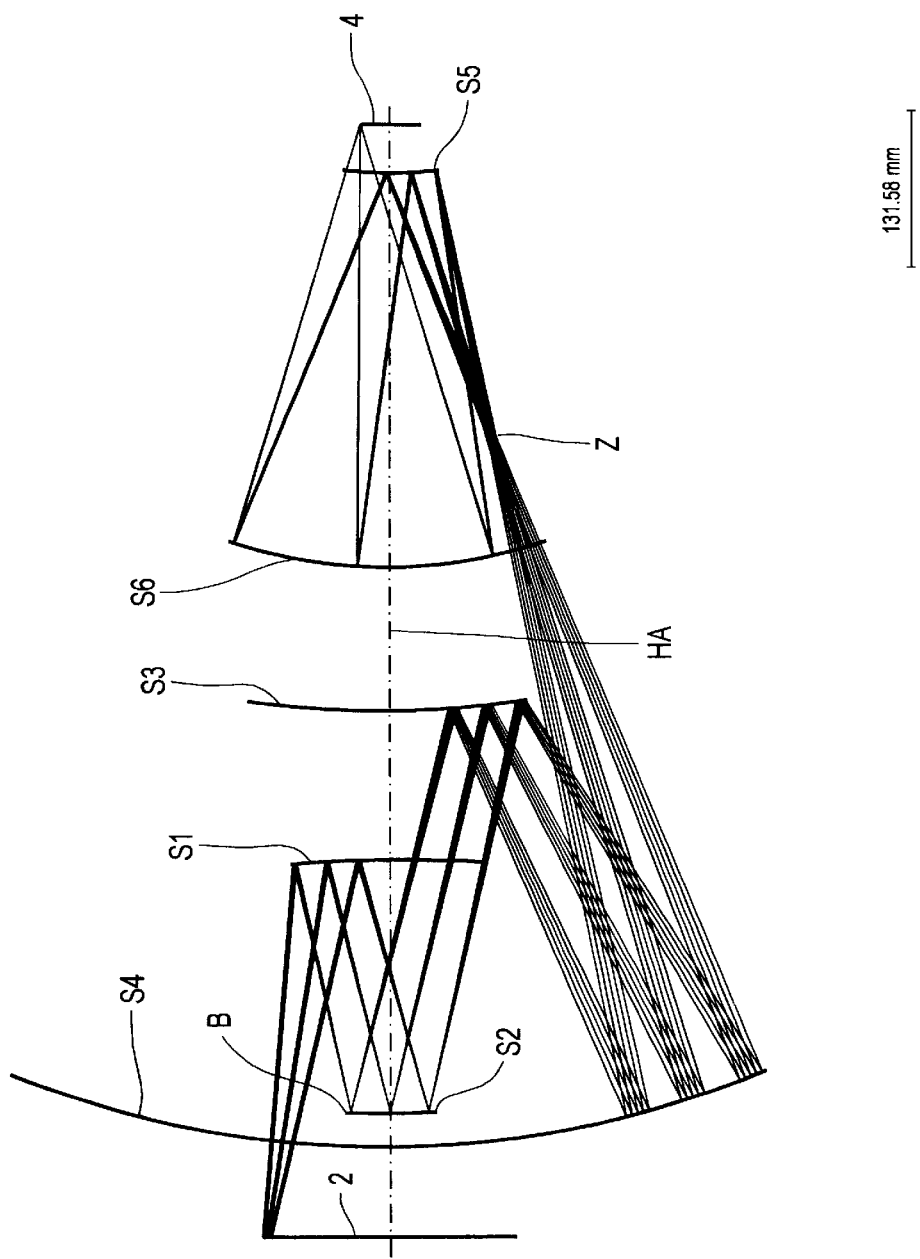

MICROLITHOGRAPHY REDUCTION OBJECTIVE AND PROJECTION EXPOSURE APPARATUS

FIELD OF THE INVENTION

The invention relates to a microlithography objective, a projection exposure apparatus containing the objective, and a method of manufacturing an integrated circuit using the same.

BACKGROUND OF THE INVENTION

Using a lithography system operating with wavelengths below 193 nm for imaging structures of below 130 nm resolution has been proposed. In fact, such lithography systems have been suggested for the extreme ultraviolet (EUV) range with wavelengths of $\lambda=11$ nm or $\lambda=13$ nm producing structures of below 100 nm. The resolution of a lithographic system is described by the following equation:

$$RES=k_1 \lambda/NA$$

where $k_1$ is a specific parameter of the lithographic process, $\lambda$ is the wavelength of the incident light, and NA is the image-side numerical aperture of the system. For example, if one assumes a numerical aperture of 0.2, then the imaging of 50 nm structures with 13 nm radiation requires a process with $k_1=0.77$. With $k_1=0.64$, the imaging of 35 nm structures is possible with 11 nm radiation.

For imaging systems in the EUV region, substantially reflective systems with multilayer coatings are available as optical components. Preferably multiple layers of Mo/Be are used as multilayer coating systems for systems operating at $\lambda=11$ nm, whereas Mo/Si systems are used for $\lambda=13$ mm. With the reflectivity of the multilayer coatings approximating 70%, it is desirable to use as few optical components as possible in applications such as EUV projection objective microlithography to achieve sufficient light intensity. Specifically, to achieve high light intensity and to allow for the correction of imaging errors, systems with six mirrors and a numerical aperture (NA)=0.20 have been used.

The six-mirror systems for microlithography have become known from the publications U.S. Pat. No. 5,686,728, EP 779,528 and U.S. Pat. No. 5,815,310. The projection lithography system according to U.S. Pat. No. 5,686,728 has a projection objective with six mirrors, where each of the reflective mirror surfaces has an aspherical form. The mirrors are arranged along a common optical axis in such a way that an obscuration-free light path is achieved. Since the projection objective known from U.S. Pat. No. 5,686,728 is used only for UV light with a wavelength of 100–300 nm, the mirrors of this projection objective have a very high asphericity of approximately ±50 $\mu$m as well as very large angles of incidence of approximately 38°. Even after reducing the aperture to NA=0.2, an asphericity of 25 $\mu$m from peak to peak remains, with little reduction in the angle of incidence. Such asphericities and angles of incidence are not practicable in the EUV region according to the present state of the art because of the higher requirements on surface quality and reflectivity of the mirrors in these latter systems.

Another disadvantage of the objectives disclosed in U.S. Pat. No. 5,686,728, which precludes their use with wavelengths below 100 nm such as the 11 nm and 13 nm wavelengths desirable for EUV microlithography, is the short distance between the wafer and the mirror lying closest to the wafer. This short distance allows only very thin mirrors to be used in the U.S. Pat. No. 5,686,728 apparatus. Because of the extreme stresses on the coatings of the multilayer systems suitable for the 11 nm and 13 nm wavelengths in question, such thin mirrors are very unstable.

A projection objective with six mirrors for use in EW lithography, even at wavelengths of 13 nm and 11 nm, has become known from EP 779,528. This projection objective also has the disadvantage that at least two of the six mirrors have very high asphericities of 26 and 18.5 $\mu$m. Unfortunately, in the EP 779,528 arrangement, the optical free working distance between the mirror next to the wafer and the wafer is so small that either instabilities occur or a negative mechanical free working distance is obtained.

Thus, it is desirable to provide a projection objective for lithography with short wavelengths, preferably smaller than 100 nm, which does not have the disadvantages of the state of the art described above.

SUMMARY OF THE INVENTION

According to an aspect of the invention, the shortcomings of the prior art are overcome by using a projection objective with six mirrors where the mirror nearest to a wafer to be illuminated is arranged in such a way that an image-side numerical aperture NA$\geq$0.15. Furthermore, the mirror nearest to the wafer is arranged in such a way that the image-side optical free working distance corresponds at least to the used diameter of the mirror next to the wafer; the image-side optical free working distance is at least the sum of one-third of the used diameter of this nearest mirror and a length between 20 and 30 mm; or the image-side optical free working distance is at least 50 mm. In a preferred embodiment, the image-side optical free working distance is 60 mm.

According to another aspect of the invention, a projection objective that includes six mirrors is characterized by an image-side numerical aperture, NA, is greater than 0.15 and the arc-shaped field width, W, at the wafer lies in the range 1.0 mm$\leq$W, and the peak-to-valley deviation, A, of the aspheres is limited with respect to the best fitting sphere in the used range on all mirrors by:

$$A \leq 19\ \mu m - 102\ \mu m(0.25-NA) - 0.7\ \mu m/mm(2\ mm - W).$$

In a preferred embodiment, the peak-to-valley distance A of the aspheres is limited on all mirrors by:

$$A \leq 12\ \mu m - 64\ \mu m(0.25-NA) - 0.3\ \mu m/mm(2\ mm - W).$$

According to yet another aspect of the invention, a projection objective that includes six mirrors is characterized by an image-side numerical aperture NA$\geq$0.15 and an image-side width of the arc-shaped field W$\geq$1 mm, and the angle of incidence AOI relative to the surface normal is limited for all beams on all mirrors by:

$$AOI \leq 23° - 35°(0.25 - NA) - 0.2°/mm\ (2\ mm - W).$$

Preferably, an embodiment of the invention would encompass all three of the above aspects, e.g., an embodiment in which the free optical working distance would be more than 50 mm at NA=0.20 and the peak-to-valley deviation of the aspheres, as well as the angles of incidence, would lie in the regions defined above.

The asphericities herein refer to the peak-to-valley (PV) deviation, A, of the aspherical surfaces with respect to the best fitting sphere in the used range. The aspherical surfaces are approximated in the examples by using a sphere with center on the figure axis vertex of the mirror and which intersects the asphere in the upper and lower endpoint of the useful range in the meridian section. The data regarding the angles of incidence always refer to the angle between the incident beam and the normal to the surface at the point of incidence. The largest angle of any incident light occurring on any of the mirrors is always given, i.e., the angle of a bundle-limiting beam. The used diameter will be defined here and below as the envelope circle diameter of the used region, which is generally not circular.

Preferably, the wafer-side optical free working distance is 60 mm.

The objective can be used not only in the EUV, but also at other wavelengths, without deviating from the scope of the invention. In any respect, however, to avoid degradation of image quality, especially degradation due to central shading, the mirrors of the projection objectives should be arranged so that the light path is obscuration-free. Furthermore, to provide easy mounting and adjusting of the system, the mirror surfaces should be designed on a surface which shows rotational symmetry to a principal axis (PA). Moreover, to have a compact design with an accessible aperture and to establish an obscuration-free path, the projection objective devices are designed to produce an intermediate image, preferably formed after the fourth mirror. In such systems, it is possible for the aperture stop to lie in the front, low-aperture objective part, with a pupil plane conjugated to the aperture stop imaged in the focal plane of the last mirror. Such a system ensures a telecentric beam path in the image space.

In an embodiment of the invention, it is provided that the freely accessible aperture stop be arranged optically and physically between the second and third mirror. Good accessibility of the aperture stop is ensured when the ratio of the distance between the first and third mirror to the distance between the first and second mirror lies in the range of:

$$0.5 < S1S3/S1S2 < 2.$$

Furthermore, in order to prevent vignetting of the light running from the third to the fourth mirror, by the aperture stop arranged between the second and third mirror, the ratio of the distance between the second mirror and aperture stop to the distance between the third mirror and the aperture stop lies in the range:

$$0.5 < S2 \text{ aperture}/(S3 \text{ aperture}) < 2.$$

By using such an elongated system, the angular loads in the front part of the projection objective can also be reduced.

An aperture stop which physically lies between the second mirror, S2, and the first mirror, S1, must be formed at least partially as a narrow ring in order to avoid clipping of light moving from S1 to S2. In such a design, there is a danger that undesirable direct light or light reflected on S1 and S2, will pass outside the aperture ring and reach the wafer. However, if the aperture stop is placed optically between the second and third mirror and physically close to the first mirror (which can be easily achieved mechanically), an efficient masking of this undesired light is possible. The aperture stop can be designed both as an opening in the first mirror or lying behind the first mirror.

In another embodiment of the invention, the aperture stop is arranged on or near the second mirror. Arrangement of the aperture on a mirror has the advantage that it is easier to achieve mechanically. Here, in order to ensure an obscuration-free beam path with simultaneously low angles of incidence, the ratio of the distance between the first and third mirrors (S1S3) to the distance between the first and second mirrors (S1S2) lies in the range:

$$0.3 \leq S1S3/S1S2 \leq 2.0,$$

while the ratio of the distance between the second and third mirrors (S2S3) to the distance between the third and fourth mirrors (S3S4) lies in the range:

$$0.7 \leq S2S3/S3S4 \leq 1.4.$$

In order to be able to make the necessary corrections of the imaging errors in the six-mirror systems, in a preferred embodiment, all six mirrors are designed to be aspherical. However, an alternative embodiment whereby at most five mirrors are aspherical thus simplifying the manufacturing process can be acheived. Then it is possible to design one mirror, preferably the largest mirror, i.e., the quaternary mirror, in the form of a spherical mirror. Moreover, it is preferred that the second to sixth mirror be in a concave—convex—concave—convex—concave sequence.

In order to achieve a resolution of at least 50 nm, the design part of the rms wavefront section of the system should be at most $0.07\lambda$ and preferably $0.03\lambda$.

Advantageously, in the embodiments of the invention, the objectives are always telecentric on the image-side. In projection systems which are operated with a reflection mask, a telecentric beam path on the object-side is not possible without illumination through a beam splitter which reduces the transmission strongly. One such device is known from JP 95 28 31 16. Therefore, the main beam angle on the reticle is chosen so that vignetting-free illumination is possible. Alternatively, in systems with transmission mask, the projection objective can be telecentric on the object side. In these embodiments, the first mirror is preferably concave. Overall, the telecentericity error on the wafer should not exceed 10 mrad and is typically between 5 mrad and 2 mrad, with 2 mrad being preferred. This ensures that changes of the imaging ratio remain within tolerable limits over the depth of focus.

In any of the embodiments of the invention, the six mirror object could additionally include a field mirror, a reducing three-mirror subsystem, or a two-mirror subsystem.

In addition to the projection objective according to the invention, the invention also makes available a projection exposure apparatus, that includes at least one projection objective device. In a first embodiment, the projection exposure apparatus has a reflection mask, while in an alternative embodiment, it has a transmission mask. Preferably, the projection exposure apparatus includes an illumination device for illuminating an off-axis arc-shaped field and the system is designed as an arc-shaped field scanner. Furthermore, the secant length of the scan slit can be at least 26 mm and the ring width be greater than 0.5 mm, so that homogeneous illumination becomes possible in the apparatus.

The invention will be described below with the aid of the drawings as examples.

BRIEF DESCRIPTION OF THE DRAWINGS

FIG. 5 is a fourth embodiment of the invention with an intermediate image, a numerical aperture NA of 0.28 as well as a free optical working distance on the image-side which is at least the sum of one-third of the useful diameter of the mirror nearest to the wafer and a length which lies between 20 and 30mm.

FIG. 6 is a fifth embodiment of the invention of a system with an intermediate image and a numerical aperture NA of 0.30.

DESCRIPTION OF THE PREFERRED EMBODIMENTS

Figure 1:
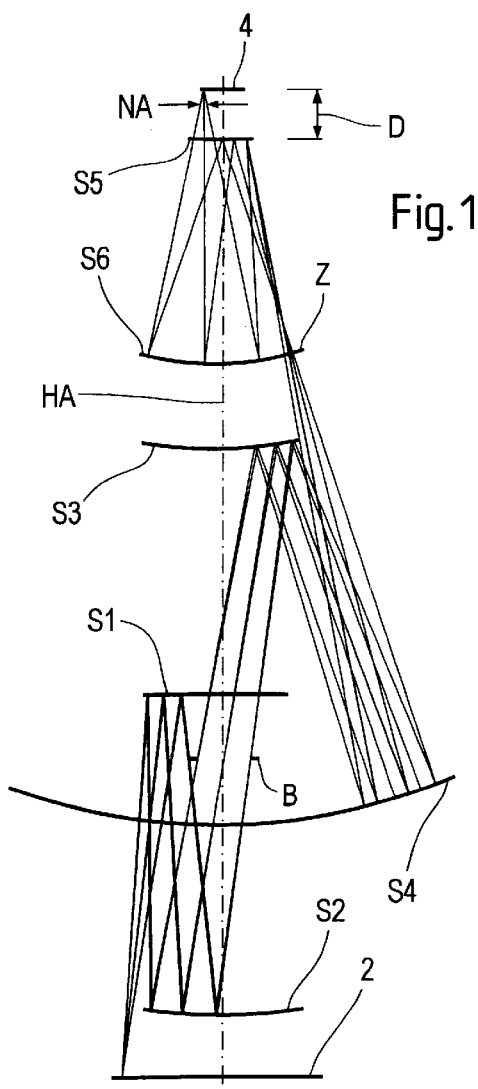
FIG. 1 is an embodiment of the invention with an intermediate image, a freely accessible aperture stop between a second and third mirror, and a numerical aperture of 0.2.
Figure 2:
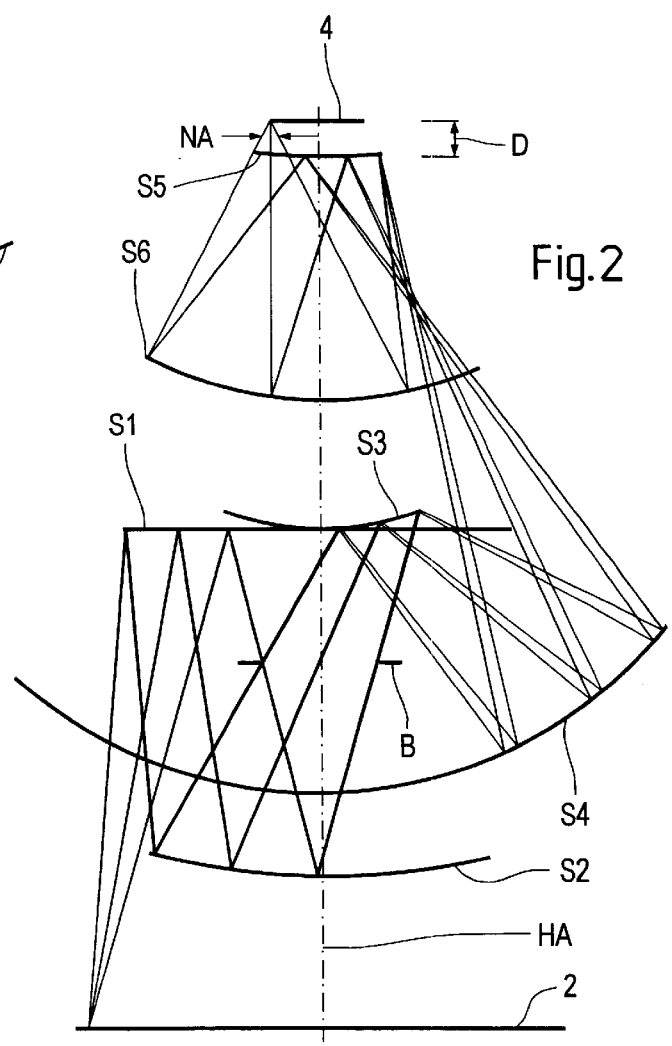
FIG. 2 is a prior art six-mirror objective arrangement for wavelengths>100 nm as disclosed in U.S. Pat. No. 5,686,728.
Figure 3:
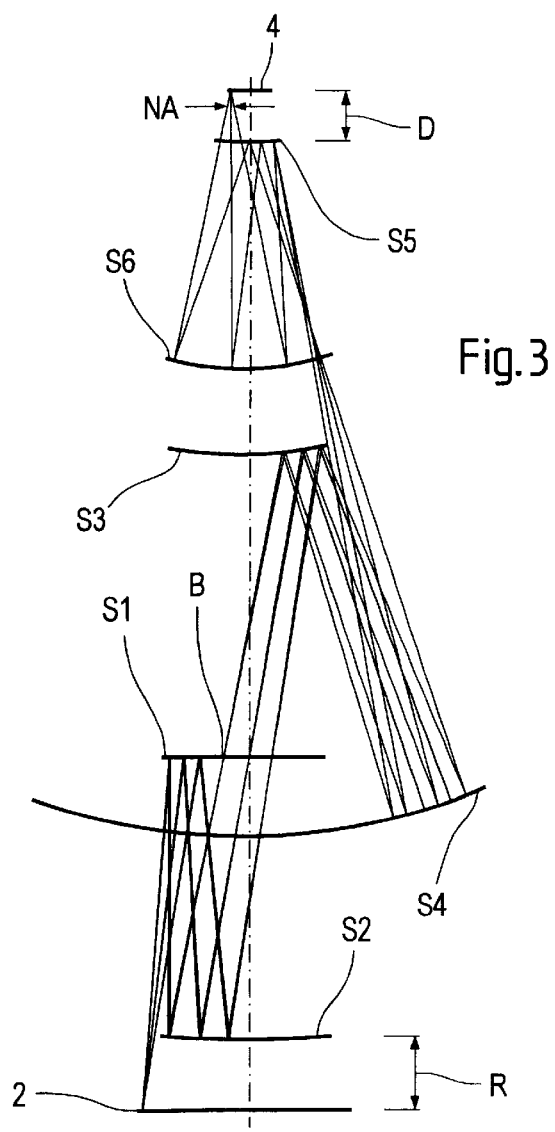
FIG. 3 is a second embodiment of the invention with an aperture stop between the second and third mirror at the first mirror.
Figure 4:
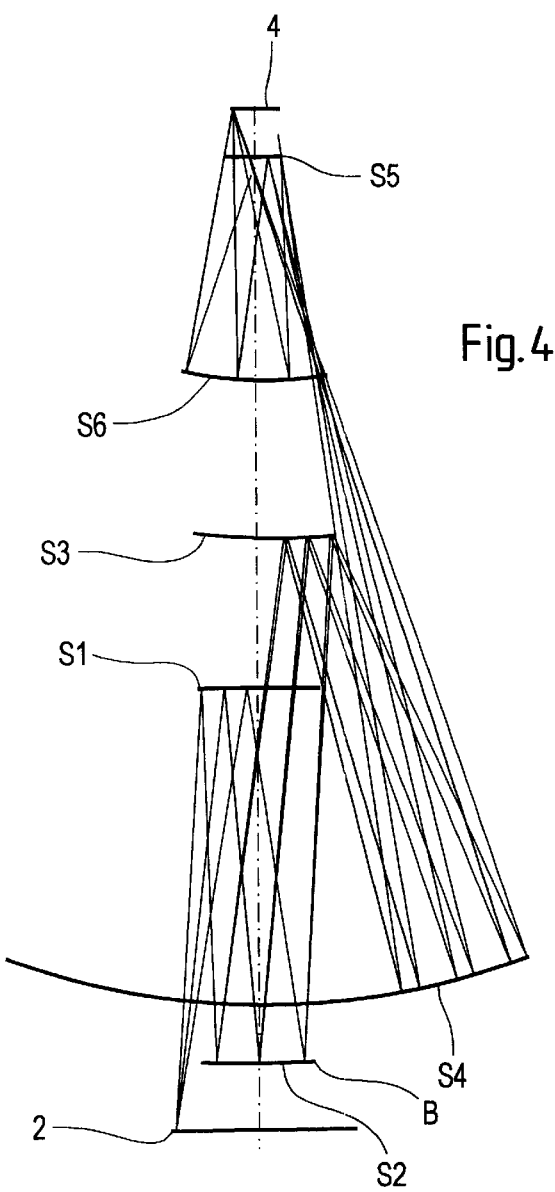
FIG. 4 is a third embodiment of the invention with an aperture stop on the second mirror and a working distance of 59 mm.

In FIGS. 1, 3 and 4, arrangements of the six-mirror projection objectives according to the invention are shown. Each has a free optical working distance that corresponds at least to the used diameter of the mirror next to the wafer. In contrast, FIG. 2 shows a prior art system for use with wavelengths>100 nm, such as the system of U.S. Pat. No. 5,686,728. In all embodiments below, the same reference numbers will be used for the same components and the following nomenclature will be employed:

first mirror (S1), second mirror (S2), third mirror (S3), fourth mirror (S4), fifth mirror (S5), and sixth mirror (S6).

In particular, FIG. 1 shows a six-mirror projection objective with a beam path from the reticle plane 2 to the wafer plane 4. The embodiment includes a field mirror S1, which forms a virtual image of an object with an imaging ratio β>0. A three-mirror system formed from S2, S3 and S4 is also provided and produces a real, reduced image of the virtual image as the intermediate image, Z. Lastly, a two-mirror system S5, S6, images the intermediate image Z in the wafer plane 4 while maintaining the requirements of telecentricity. The aberrations of the three-mirror and two-mirror subsystems are balanced against one another so that the total system has a high quality output sufficient for integrated circuit fabrication applications.

The physical aperture stop B is arranged between the second mirror S2 and the third mirror S3. And, as is clear from FIG. 1, the aperture stop is accessible in the beam path between the second mirror S2 and the third mirror S3. Furthermore, the distance between the mirror next to the wafer, i.e., the 5th mirror S5 in the present embodiment, and the plane of the wafer 4 is greater than the used diameter of mirror S5. In other words, the following condition is fulfilled:

optical distance from S5 to the wafer plane 4>used diameter of S5. Other distance requirements are also possible and may be used, such as the distance is (1) greater than the sum of one-third of the used diameter of the mirror next to the wafer, S5, and 20 mm, or (2) greater than 50 mm. In the preferred embodiment, the distance is 60 mm.

Such a distance guarantees a sufficiently free working distance, one greater than 0, and allows the use of optical components compatible for use with wavelengths<100 nm, and preferably wavelengths of 11 to 13 nm. Optical components in this range include, for example, Mo/Si or Mo/Be multilayer systems, where the typical multilayer systems for λ=13 nm is Mo/Si layer pairs and for λ=11 nm, is Mo/Be systems, both of approximately 70 layer pairs. Reflectivities attainable in such systems are approximately 70%. In the multilayer layer systems, layer stresses of above 350 MPa may occur. Stresses of such values may induce surface deformation, especially in the edge regions of the mirror.

The systems according to the invention, as they are shown, for example, in FIG. 1, have:

$$RES = k_1 \lambda / NA.$$

This results in a nominal resolution of at least 50 nm and 35 nm at a minimum numerical aperture of NA=0.2 for $k_1$=0.77 and λ=13 nm, and for $k_1$=0.64 and λ=11 nm, respectively, where $k_1$ is a parameter specific for the lithographic process.

Furthermore, the beam path of the objective shown in FIG. 1 is obscuration-free. For example, in order to provide image formats of 26×34 mm² or 26×52 mm², the projection objectives according to the invention are preferably used in an arc-shaped field scan projection exposure apparatus, wherein the secant length of the scan slit is at least 26 mm.

Numerous masks can be used in the projection exposure apparatus, including transmission masks, stencil masks and reflection masks, and the system, which is telecentric on the image-side, can be telecentric or non-telecentric on the object side depending on which mask is used. For example, to form a telecentric beam path on the object-side when using a reflection mask a transmission-reducing beam splitter must be employed. With a non-telecentric beam path on the object-side, unevennesses of the mask leads to dimensional errors in the image. Therefore, the chief ray angles at the reticle plane are preferably below 10°, so that the requirements for reticle evenness lies in an achievable range. Moreover, the system of FIG. 1 has an image-side telecentering error at the wafer level of 1 mrad for a numerical aperture of 0.2.

Due to the high image-side telecentricity, the entrance pupil of the last mirror S6 is at or near the focal plane of this mirror. Therefore, in systems such as this with an intermediate image, the aperture, B, is in the front, low-aperture stop objective part, mainly between the first and third mirror S1, S3 in regard to the light radiation path, and the pupil plane conjugated with the aperture stop will be imaged in the focal plane of the last mirror.

All mirrors S1–S6 of FIG. 1 are designed to be aspherical, with a maximum asphericity of approximately 7.3 μm. The low asphericity of the arrangement is advantageous from a manufacturing point of view, since the technological difficulties in processing the surfaces of the multilayer mirrors increases proportionally with aspherical deviation and gradient of the asphere.

The highest angle of incidence of the six-mirror objective occurs on the fifth mirror S5 and is approximately 18.4°. The maximum variation of the angles of incidence over the mirror also occurs on mirror S5 and is approximately 14.7°. The wavefront error at λ=13 nm is better than 0.032λ; the center of gravity displacement of the point images is<3 nm; and the static, dimension-corrected distortion lies at 4 mn.

The aperture stop between the second and third mirror is freely accessible. Vignetting of the light from S3 to S4 through the aperture stop is prevented with simultaneously acceptable angles of incidence on the mirrors when the following conditions are fulfilled:

$$0.5 < S1S3 / S1S2 < 2$$

and $$0.5 < S2 \text{ aperture} / (S3 \text{ aperture}) < 2.$$

Here, the abbreviation S1S3 means the mechanical distance between the vertices of the mirrors S1 and S3. And, "S2 aperture" means the mechanical distance between the vertex of mirror S2 and the aperture. Furthermore, in order to reduce the angle of incidence on the mirrors in any of the embodiments of FIGS. 1, 3, and 4, the distance from reticle to S1 is made smaller than the distance from S2 to S3, i.e., the following applies:

reticle $S1<S2S3$.

Preferably, the reticle lies sufficiently far in front of the first mirror (e.g., S2) along the direction of incident light between the reticle and the first mirror. In the present case, for example, the distance between the reticle and S2 is 80 mm.

Furthermore, in the embodiments of FIGS. 1 and 3 to 5, the distance between the mirrors S3 and S6 is chosen to be of such a magnitude that mirrors of sufficient thickness can be used, thicker mirrors having strength, stability properties that can withstand the high layer tensions described above. In these systems, the following relationship is preferred:

0.3(used diameter $S3$+used diameter $S6$)<$S3S6$.

In the following table, the parameters of the system represented in FIG. 1 are exemplarily shown in Code V(™) nomenclature. The objective is a 5× system with a 26×2 mm$^2$ arc-shaped field and a numerical aperture of 0.2. The mean image side radius of the system is approximately 26 mm.

ricities of ±50 μm and a maximum angle of incidence of 38°. From a manufacturing and coating technology point of view, such asphericities and angles of incidence are incompatible for use in the EUV region.

FIG. 3 is an alternative embodiment of a six-mirror system in which the aperture stop is on the first mirror. The same components as in FIG. 1 again receive the same reference number in FIG. 3. The distance to the wafer is 60 mm in this embodiment, as it was in the embodiment of FIG. 1, and thus it is greater than the diameter of the mirror next to the wafer, S5. Similarly, as with FIG. 1, the distance between S2 and S3 was increased significantly in comparison to that of U.S. Pat. No. 5,686,728, so that large angles of incidence can be avoided in the system.

One difference from the objective of FIG. 1, is that in FIG. 3 the aperture stop B is placed on the first mirror S1. As a result of this position, a reduction in vignetting from the light reflected on S2 is possible, whereas with the physical aperture stop positioned between S1 and S2 light could pass above the aperture stop which is designed as a narrow ring. In the embodiment shown in FIG. 3, the aperture can be either an opening in the S1 mirror or an aperture disposed behind S1.

Another advantage of the this embodiment is the spherical design of mirror S4, which presents advantages especially

TABLE 1

| element No. | radius | thickness | diameter | type |
|---|---|---|---|---|
| object | INF | 80.9127 | 258.1723 | |
| | | 413.0257 | | |
| S1 | A(1) | −88.8251 | 197.5712 | REFL |
| | | −324.2006 | 195.6194 | |
| | | 0.0000 | 188.6170 | |
| S2 | A(2) | 324.2006 | 188.7078 | REFL |
| | | aperture | 67.1796 | |
| | | 423.6214 | 183.2180 | |
| | | 0.0000 | | |
| S3 | A(3) | −423.6214 | 184.7062 | REFL |
| | | −74.9270 | 519.0546 | |
| S4 | A(4) | 498.5484 | 541.0453 | REFL |
| | | 109.8242 | 248.6244 | |
| | | 281.5288 | 177.5488 | |
| S5 | A(5) | −281.5288 | 65.0842 | REFL |
| S6 | A(6) | 281.5288 | 187.9549 | REFL |
| | | | 78.3999 | |
| image | image width | 59.9202 | 53.9889 | | aspherical constants:
$$Z = (CURV) Y^2/[1 + (1 − (1 + K)(CURV)^2 Y^2)^{1/2}] + (A)Y^4 + (B)Y^6 + (C)Y^8 + (D)Y^{10}$$

| asphere | CURV | K | A | B | C | D |
|---|---|---|---|---|---|---|
| A(1) | 0.00031800 | −27.686599 | 0.00000E+00 | 1.32694E−15 | 2.00546E−20 | −8.49471E−25 |
| A(2) | 0.00094928 | −3.998204 | 0.00000E+00 | 4.03849E−15 | −6.15047E−20 | 2.73303E−25 |
| A(3) | 0.00126752 | 0.424198 | 0.00000E+00 | 1.58766E−15 | −8.27965E−20 | 2.80328E−24 |
| A(4) | 0.00123850 | 0.023155 | 0.00000E+00 | 2.46048E−17 | −1.08266E−22 | 3.75259E−28 |
| A(5) | 0.00329892 | 2.902916 | 0.00000E+00 | 1.55628E−12 | −6.71619E−17 | −5.30379E−21 |
| A(6) | 0.00277563 | 0.072942 | 0.00000E+00 | 2.96285E−16 | 3.99125E−21 | 4.55007E−26 |

Reference wavelength = 13 nm

FIG. 2 shows an arrangement of a projection objective for microlithography with a wavelength of λ<100 nm according to U.S. Pat. No. 5,686,728. Components substantially similar to those of FIG. 1 are provided with the same reference numbers. As is clear, the distance between the mirror next to the wafer S5 and the wafer is significantly smaller than the diameter of the mirror, lying mainly in the range of approximately 20 mm. This leads to strength, stability problems for the optics in the EUV region because of the extreme tensions in the layers. Furthermore, the system has very high asphefrom the point of view of manufacturing, because mirror S4 is the largest mirror of the system. With such a design, the asphericity in the used range is increased slightly to 10.5 μm. The largest angle of incidence occurs on mirror S5 and is approximately 18.6°. The wavefront error of the arrangement is 0.032λ, within the 1.7 mm wide arc-shaped field at λ=13 nm. Furthermore, if the mirror S4 is designed to be slightly aspherical with 0.4 μm, then the wavefront error can be kept to 0.031λ within a 1.8 mm wide arc-shaped field at λ=13 nm. Efficient masking of the undesirable light is obtained not only when the aperture stop is formed directly on mirror S1, but also when it is arranged behind, i.e., after, mirror S1. Preferably, the aperture stop is positioned such that the following relationship is obtained:

$$S2S1 \leq 0.9 \times S2 \text{ aperture.}$$

Table 2 shows the constructional data of the 5× objective according to FIG. 3 in Code V(™) nomenclature, where the fourth mirror S4 is spherical. The mean radius of the 26×1.7 mm² image field is approximately 26 mm.

relative ease makes this arrangement advantageous. The system of FIG. 4 is a 4× reduction system with a wavefront error of 0.021λ within a 2 mm wide arc-shaped field at λ=13 nm. The maximum asphericity in the used range lies at 11.2 μm, and the largest angle of incidence, which occurs at S5, is approximately 18.3°. The mean image field radius is approximately 26 mm, as with the previous two embodiments. Furthermore, the distance between the wafer and the mirror next to the wafer, S5, is greater than the diameter of

TABLE 2

| element No. | radius | thickness | diameter | type |
|---|---|---|---|---|
| object | INF | 85.2401 | 256.1389 | |
| | | 358.4668 | | |
| S1 | A(1) | 0.0024 | 203.8941 | REFL |
| | | −358.4691 | 203.8845 | |
| | | 0.0000 | 201.9677 | |
| S2 | A(2) | 358.4691 | 201.9942 | REFL |
| | | aperture | 60.7572 | |
| | | 390.5456 | 187.2498 | |
| | | 0.0000 | | |
| S3 | A(3) | −390.5456 | 188.9474 | REFL |
| | | −104.1273 | 505.8686 | |
| S4 | A(4) | 494.6729 | 550.3686 | RFFL |
| | | 114.3062 | 256.9217 | |
| | | 281.6969 | 181.7337 | |
| S5 | A(5) | −281.6969 | 64.4286 | REFL |
| S6 | A(6) | 281.6969 | 187.8549 | REFL |
| | | | 78.1545 | |
| image | image width | 60.0041 | 53.6996 | | aspherical constants:
$$Z = (CURV) Y^2 / [1 + (1 − (1 + K)(CURV)^2 Y^2)^{1/2}] + (A)Y^4 + (B)Y^6 + (C)Y^8 + (D)Y^{10}$$

| asphere | CURV | K | A | B | C | D |
|---|---|---|---|---|---|---|
| A(1) | 0.00035280 | −58.238840 | 0.00000E+00 | 2.14093E−15 | 2.29498E−20 | 0.00000E+00 |
| A(2) | 0.00097971 | −4.160335 | 0.00000E+00 | 1.54696E−15 | 8.15622E−21 | 0.00000E+00 |
| A(3) | 0.00117863 | −2.136423 | 0.00000E+00 | −1.78563E−16 | 3.45455E−20 | 0.00000E+00 |
| A(4) | 0.00124362 | 0.000000 | 0.00000E#00 | 0.00000E+00 | 0.00000E+00 | 0.00000E+00 |
| A(5) | 0.00338832 | 2.909987 | 0.00000E+00 | 7.90123E−13 | 7.04899E−17 | 0.00000E+00 |
| A(6) | 0.00278660 | 0.062534 | 0.00000E+00 | 2.79526E−16 | 7.00741E−21 | 0.00000E+00 |

Reference wavelength = 13 nm

Another embodiment is shown in FIG. 4, where again the same reference numbers are used for the same components as in the previous figures. Here, the aperture stop B is placed optically and physically on the secondary mirror or second mirror S2. The ability to place the aperture stop on S2 with relative ease makes this arrangement advantageous. The the mirror next to the wafer, S5, and lies at around 59 mm in this embodiment.

Table 3 shows the optical parameters of the embodiment of FIG. 4 in Code V(™) nomenclature.

TABLE 3

| element No. | radius | thickness | diameter | type |
|---|---|---|---|---|
| object | INF | 84.0595 | 205.6642 | |
| | | 473.5521 | | |
| S1 | A(1) | 145.8261 | 147.3830 | REFL |
| | | −327.7260 | 136.4700 | |
| | | aperture | 112.0176 | |
| | | 0.0000 | | |
| S2 | A(2) | 473.5521 | 112.1228 | REFL |
| | | 190.4830 | 163.5236 | |
| | | 0.0000 | 184.4783 | |
| S3 | A(3) | 190.4830 | 185.3828 | REFL |
| | | −399.1713 | 358.6720 | |
| S4 | A(4) | 589.6560 | 654.5228 | REFL |
| | | 207.5220 | 310.1977 | |
| | | 276.2668 | 175.3066 | |
| S5 | A(5) | −276.2668 | 65.2138 | REFL |

TABLE 3-continued

| S6 | A(6) | 276.2668 | 182.8159 | REFL |
|---|---|---|---|---|
|  |  |  | 77.5085 |  |
| image | image width | 59.0000 | 53.9968 |  | aspherical constants:
$$Z = (CURV) Y^2/[1 + (1 - (1 + K)(CURV)^2 Y^2)^{1/2}] + (A)Y^4 + (B)Y^6 + (C)Y^8 + (D)Y^{10}$$

| asphere | CURV | K | A | B | C | D |
|---|---|---|---|---|---|---|
| A(1) | 0.00015851 | 441.008070 | 0.00000E+00 | −3.49916E−16 | 1.27478E−19 | −3.37021E−25 |
| A(2) | 0.00089932 | −5.032907 | 0.00000E+00 | −6.95852E−15 | −7.53236E−20 | −2.74751E−24 |
| A(3) | 0.00188578 | 0.913039 | 0.00000E+00 | −1.60100E−15 | −9.53850E−20 | 1.30729E−26 |
| A(4) | 0.00108147 | 0.038602 | 0.00000E+00 | 2.48925E−18 | −5.29046E−24 | −4.37117E−31 |
| A(5) | 0.00269068 | 7.253316 | 0.00000E+00 | −5.70008E−13 | −9.32236E−17 | −6.09046E−21 |
| A(6) | 0.00281036 | 0.150957 | 0.00000E+00 | 1.30822E−15 | 1.86627E−20 | 5.08158E−25 |

Reference wavelength = 13 nm

FIG. 5 shows an embodiment of the invention which includes a field mirror S1, a first subsystem with the second to fourth mirror S2–S4 and a second subsystem with the fifth and sixth mirror, S5, S6. The field mirror S1 with imaging ratio, β, β>0 produces a virtual image of the object 2. The virtual image is then imaged by the first subsystem consisting of the second, third and fourth mirrors, S2, S3, S4, which has β<0, producing a real intermediate image Z. The real intermediate image Z is imaged as the real system image on wafer plane 4 by the second subsystem which consists of the fifth and sixth mirrors, S5, S6. The numerical aperture of the system is NA=0.28. The optical free working distance system between the last mirror S5 and the wafer plane 4 corresponds to at least the sum of one-third of the used diameter of the mirror nearest to the wafer and a length which lies between 20 and 30 mm. The aperture stop B lies on the second mirror S2.

Table 4 shows the optical parameters of the embodiment of FIG. 6 in Code V(™) nomenclature.

TABLE 4

| element No. | radius | thickness | diameter | type |
|---|---|---|---|---|
| object | INF | 151.2625 | 194.7605 |  |
|  |  | 229.0820 |  |  |
| S1 | A(1) | −39.4068 | 162.9862 | REFL |
|  |  | −189.6752 | 147.1426 |  |
|  |  | aperture | 65.0637 |  |
|  |  | 0.0000 |  |  |
| S2 | A(2) | 229.0820 | 65.1650 | REFL |
|  |  | 137.5708 | 168.3504 |  |
|  |  | 0.0000 | 230.5128 |  |
| S3 | A(3) | −137.5708 | 234.0072 | REFL |
|  |  | −300.3445 | 386.2567 |  |
| S4 | A(4) | 437.9153 | 630.7784 | REFL |
|  |  | 133.0981 | 343.1578 |  |
|  |  | 353.0840 | 257.0225 |  |
| S5 | A(5) | −353.0840 | 79.9521 | REFL |
| S6 | A(6) | 353.0840 | 264.2853 | REFL |
|  |  |  | 78.6376 |  |
| image | image width | 44.0000 | 54.0051 |  | aspherical constants:
$$Z = (CURV) Y^2/[1 + (1 - (1 + K)(CURV)^2 Y^2)^{1/2}] + (A)Y^4 + (B)Y^6 + (C)Y^8 + (D)Y^{10} + (E)Y^{12} + (F)Y^{14} + (G)Y^{16} + (H)Y^{18} + (J)Y^{20}$$

| asphere | CURV | K / E | A / F | B / G | C / H | D / J |
|---|---|---|---|---|---|---|
| A(1) | −0.00080028 | 0.000000 | −3.35378E−09 | 5.36841E−14 | −7.86902E−19 | −5.07886E−24 |
|  |  | 0.00000E+00 | 0.00000E+60 | 0.00000E+00 | 0.00000E+00 | 0.00000E+00 |
| A(2) | 0.00040002 | 0.000000 | 1.68187E−08 | 2.05570E−12 | 2.42710E−16 | 5.69764E−20 |
|  |  | 0.00000E+00 | 0.00000E+00 | 0.00000E+00 | 0.00000E+00 | 0.00000E+00 |
| A(3) | 0.00113964 | −2.760663 | 0.00000E+00 | −3.55779E−15 | 1.03881E−19 | −3.64996E−24 |
|  |  | 0.00000E+00 | 0.00000E+00 | 0.00000E+00 | 0.00000E+00 | 0.00000E+00 |
| A(4) | 0.00128753 | 0.019273 | 0.00000E+00 | 5.82746E−18 | −1.77496E−22 | 1.64954E−27 |
|  |  | −6.20361E−33 | 0.00000E+00 | 0.00000E+00 | 0.00000E+00 | 0.00000E+00 |
| A(5) | 0.00373007 | 11.6888968 | 0.00000E+00 | −5.53902E−12 | −4.32712E−16 | −1.54425E−19 |
|  |  | 0.00000E+00 | 0.00000E+00 | 0.00000E+00 | 0.00000E+00 | 0.00000E+00 |
| A(6) | 0.00240387 | −0.002567 | 0.00000E+00 | −6.78955E−16 | −8.39621E−21 | −2.95854E−25 |
|  |  | 0.00000E+00 | 0.00000E+00 | 0.00000E+00 | 0.00000E+00 | 0.00000E+00 |

Reference wavelength = 13 nm

FIG. 6 shows a similar, yet alternative, embodiment to that of FIG. 5 with a six-mirror objective with field mirror S1 as well as first and second subsystems as found in FIG. 5. The objective produces an intermediate image Z and has an aperture B formed on the second mirror S2 similar to that of FIG. 5 and a numerical aperture NA=0.30. The optical parameters of this alternative embodiment are shown in Table 5 in Code V(™) nomenclature.

elements are relatively low, the angles of incidence are small, and the space for mirror carriers is large.

What I claim is:

1. A projection objective for use in short wavelength microlithography, comprising;

six mirrors (a first mirror (S1), a second mirror (S2), a third mirror (S3), a fourth mirror (S4), a fifth mirror (S5) disposed closest to an object to be illuminated and

TABLE 5

| element No. | radius | thickness | diameter | type |
|---|---|---|---|---|
| object | INF | 103.2808 | 197.1874 | |
| | | 219.3042 | | |
| S1 | A(1) | −39.2890 | 157.6222 | REFL |
| | | −180.0152 | 142.1492 | |
| | | aperture | 67.2659 | |
| | | 0.0000 | | |
| S2 | A(2) | 219.3042 | 67.4347 | REFL |
| | | 131.2051 | 167.6895 | |
| | | 0.0000 | 228.0182 | |
| S3 | A(3) | −131.2051 | 232.3162 | REFL |
| | | −247.5850 | 401.4441 | |
| S4 | A(4) | 378.7901 | 613.5493 | REFL |
| | | 134.4001 | 355.7774 | |
| | | 348.5086 | 268.3735 | |
| S5 | A(5) | −348.5086 | 81.5255 | REFL |
| S6 | A(6) | 348.5086 | 269.2435 | REFL |
| | | | 75.4983 | |
| image | image width | 36.1195 | 53.9942 | | aspherical constants:
$$Z = (CURV) Y^2/[1 + (1 - (1 + K) (CURV)^2 Y^2)^{1/2}] + (A)Y^4 + (B)Y^6 + (C)Y^8 + (D)Y^{10} + (E)Y^{12} + (F)Y^{14} + (G)Y^{16} + (H)Y^{18} + (J)Y^{20}$$

| asphere | CURV | K<br>E | A<br>F | B<br>G | C<br>H | D<br>J |
|---|---|---|---|---|---|---|
| A(1) | −0.00061615 | 0.000000<br>−7.07209E−27 | −5.19402E−09<br>0.00000E+00 | 1.09614E−13<br>0.00000E+00 | −3.44621E−18<br>0.00000E+00 | 1.58573E−22<br>0.00000E+00 |
| A(2) | 0.00066911 | 0.000000<br>1.84514E−29 | 1.69112E−08<br>0.00000E+00 | 2.39908E−12<br>0.00000E+00 | 2.89763E−16<br>0.00000E+00 | 1.00572E−19<br>0.00000E+00 |
| A(3) | 0.00140031 | 0.000000<br>−2.23484E−28 | −8.71271E−10<br>0.00000E+00 | −1.47622E−15<br>0.00000E+00 | −3.40869E−20<br>0.00000E+00 | 4.32196E−24<br>0.00000E+00 |
| A(4) | 0.00143731 | 0.000000<br>1.49857E−32 | 2.18165E+12<br>−8.61043E−38 | 2.65405E−17<br>0.00000E+00 | −2.01757E−22<br>0.00000E+00 | 1.14856E−28<br>0.00000E+00 |
| A(5) | 0.00378996 | 0.000000<br>5.75469E−24 | 8.54406E−08<br>0.00000E+00 | 2.25929E−12<br>0.00000E+00 | 3.36372E−16<br>0.00000E+00 | 1.92565E−20<br>0.00000E+00 |
| A(6) | 0.00246680 | 0.000000<br>5.91279E−30 | −3.61754E−12<br>0.00000E+00 | −8.29704E−16<br>0.00000E+00 | −1.53440E−20<br>0.00000E+00 | −2.24433E−25<br>0.00000E+00 |

Reference wavelength = 13 nm

Figure 7A:
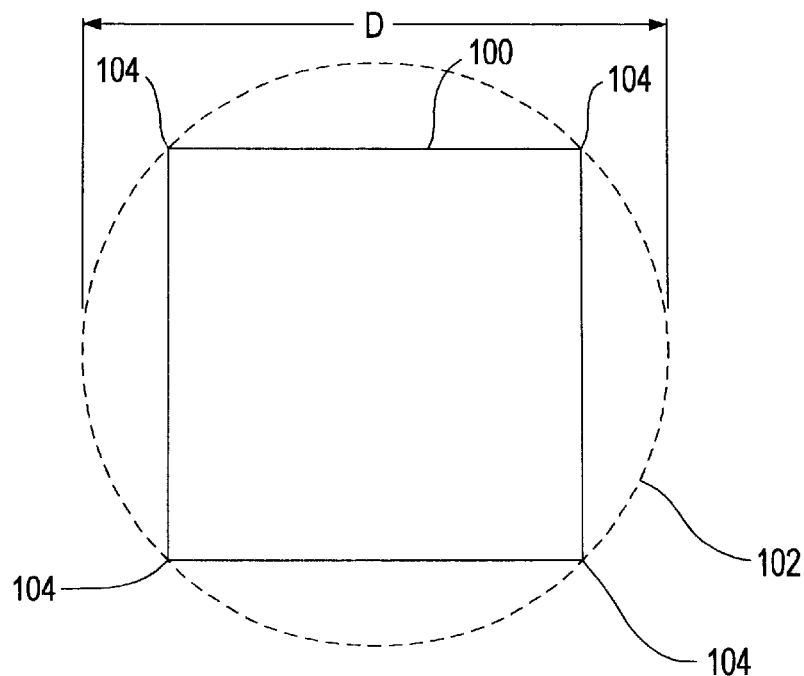
FIGS. 7A and 7B show the used diameter for differently illuminated light fields.
Figure 7B:
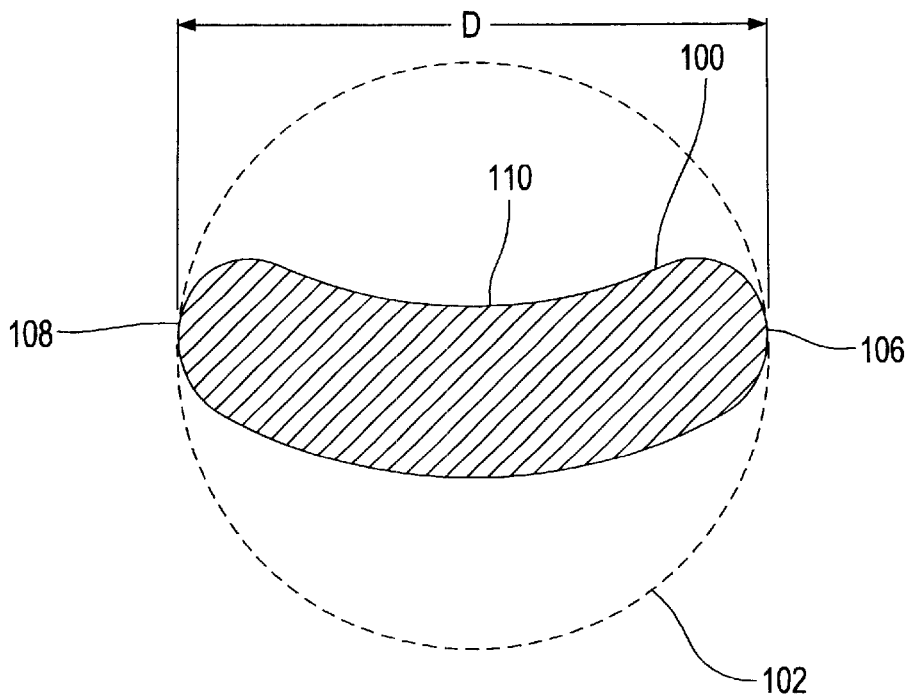

FIGS. 7A and 7B define the used diameter D of the above embodiments. As an example, the illuminated field 100 on a mirror in FIG. 7A is a rectangular field. The used diameter D is then the diameter of the envelope circle 102, which encompasses the rectangle 100, where the corners 104 of the rectangle 100 are on the envelope circle 102. A second example is shown in FIG. 7B. The illuminated field 100 has a kidney shape, which is expected for the useful range when using the objective according to the invention in a microlithography projection illumination apparatus. The envelope circle 102 encompasses the kidney shape fully and it coincides with the edge 110 of the kidney shape at two points, 106, 108. The used diameter D is then given by the diameter of the envelope circle 102.

Thus, the invention provides a six-mirror projection objective with an imaging scale of preferably 4×, 5× or 6× for use in an EUV arc-shaped field projection system. Other uses may be employed, however. The six-mirror projection objective has the resolution required for the image field and has a functional structural design, since the aspheres of the a sixth mirror (S6)) arranged such that an image-side numerical aperture (NA) is NA≧0.15, and wherein said fifth mirror is positioned such that at least one of the following conditions is satisfied:

an image-side optical free working distance is greater than or equal to a used diameter D of the fifth mirror;

the image-side optical free working distance is greater than or equal to a sum of one-third of the used diameter of the fifth mirror and a length between 20 mm and 30 mm; and the image-side optical free working distance is at least 50 mm.

2. A projection objective for use in short wavelength microlithography, comprising;

six mirrors (a first mirror (S1), a second mirror (S2), a third mirror (S3), a fourth mirror (S4), a fifth mirror (S5) disposed closest to an object to be illuminated, and a sixth mirror (S6)) arranged such that an image-side numerical aperture (NA) is NA≧0.15 and an arc-shaped field width (W) at the object, lies in the range of 1.0 mm≦W, and wherein each of said six mirrors has a maximum aspherical peak-to-valley (PV) deviation (A) from a best-fitting sphere in the following range:

$$A \leq 19\ \mu m - 102\ \mu m(0.25-NA) - 0.7\ \mu m/mm(2\ mm - W).$$

3. A projection objective for use in short wavelength microlithography, comprising;
a first mirrors (S1), a second mirrors (S2), a third mirrors (S3), a fourth mirrors (S4), a fifth mirrors (S5) disposed closest to an object to be illuminated, and a sixth mirrors (S6)) arranged such that an image-side numerical aperture (NA) is NA≧0.15 and an image-side arc-shaped field width (W) lies in the range of 1.0 mm≦W, and wherein light incident on each of the six mirrors has an angle of incidence (AOI) relative to the surface normal of said mirrors that lies in the range:

$$AOI \leq 23° - 35°(0.25-NA) - 0.2°/mm(2\ mm - W).$$

4. A projection objective for use in short wavelength microlithography, comprising;
a field mirror (S1) with an imaging ratio $\beta_1 > 0$, wherein the field mirror produces a virtual image of an object;
a first subsystem with a second mirror (S2), a third mirror (S3), and a fourth mirror (S4), wherein the first subsystem has an imaging ration $\beta_2 < 0$, and wherein said first subsystem images the virtual image to a real intermediate image;
a second subsystem with a fifth mirror (S5) disposed closest to an object to be illuminated and a sixth mirror (S6), wherein the second system images the intermediate image to an image plane as a real system image; and
wherein the objective has an image-side numerical aperture (NA) and an arc-shaped field width (W) at an object to be illuminated.

5. A projection objective according to any one of claims 2 to 4, wherein the fifth mirror is further positioned such that at least one of the following conditions is satisfied:
an image-side optical free working distance is greater than or equal to a used diameter of the fifth mirror;
the image-side optical free working distance is greater than or equal to a sum of one-third of the used diameter of the fifth mirror and a length between 20 mm and 30 mm; and
the image-side optical free working distance is at least 50 mm.

6. A projection objective according to any one of claims 3 and 4, wherein the image-side numerical aperature NA is 0.15≦NA, the arc-shaped field width W at the object is 1.0 mm≦W, and each of said mirrors has a maximum aspherical peak-to-valley (PV) deviation (A) of the aspheres from a best-fitting sphere in the following range:

$$A \leq 19\ \mu m - 102\ \mu m(0.25-NA) - 0.7\ \mu m/mm(2\ mm - W).$$

7. A projection objective according to any one of claims 1 to 4, wherein the mirrors are arranged to produce an obscuration-free light path.

8. A projection objective according to any one of claims 1 to 4, wherein the mirrors have a rotational symmetry with respect to a principal axis (PA).

9. A projection objective according to any one of claims 1 to 4, wherein an intermediate image is formed after the fourth mirror (S4).

10. A projection objective according to claim 9, further comprising an aperture stop (B) in a light path positioned between the second mirror (S2) and the third mirror (S3).

11. A projection objective according to claim 10, wherein distances between the first mirror, second mirror and third mirror are chosen in such a way that the aperture stop is freely accessible.

12. A projection objective according to claim 11, wherein a ratio of a distance between the first mirror and the third mirror (S1S3) to a distance between the first mirror and the second mirror (S1S2) is in the range of:

$$0.5 < S1S3/S1S2 < 2.$$

13. A projection objective according to any one of claims 1 to 4, further comprising an aperture stop (B) positioned between the second mirror (S2) and the third mirror (S3) at the first mirror (S1).

14. A projection objective according to any one of claims 1 to 4 wherein the image-side numerical aperture (NA) is NA≧0.15 and the arc-shaped field width at the object is W≧1.0 mm and the peak-to-valley (PV) deviation of the aspheres to the best fitting sphere is in the following range:

$$A \leq 12\ \mu m - 64\ \mu m(0.25-NA) - 0.3\ \mu m/mm(2\ mm - W).$$

15. A projection objective according to any one of claims 1 to 4, further comprising an aperture stop (B) disposed on or near the second mirror (S2).

16. A projection objective according to claim 15, wherein a ratio of a distance between the first mirror and the third mirror (S1S3) to a distance between the first mirror and the second mirror (S1S2) lies in the range:

$$0.3 < S1S3/(S1S2) < 2,$$

and wherein a ratio of a distance between the second mirror and third mirror (S2S3) to a distance between the third mirror and the fourth mirror (S3S4) lies in the range:

$$0.7 < S2S3/(S3S4) < 1.4.$$

17. A projection objective according to any one of claims 1 to 4, wherein all mirrors are aspherical.

18. A projection objective according to any one of claims 1 to 4, wherein at most five mirrors are aspherical.

19. A projection objective according to any one of claims 1 to 4, wherein the second mirror, third mirror, fourth mirror, fifth mirror, and sixth mirror are in a concave-convex-concave-convex-concave sequence.

20. A projection objective according to any one of claims 1 to 4, wherein an imaging ratio ($\beta$) of the first mirror (S1) is positive.

21. A projection objective according to any one of claims 1 to 4, wherein an imaging ratio ($\beta$) of a subsystem formed by the second mirror (S2), third mirror (S3) and fourth mirror(S4) is negative.

22. A projection objective according to any one of claims 1 to 4, wherein an rms wave-front error of the objective is at most 0.07 $\lambda$ over an entire image field.

23. A projection objective according to claim 22, wherein a width of the image field is at least 1.0 mm.

24. A projection objective according to any one of claims 1 to 4, wherein said objective is telecentric on any image-side.

25. A projection objective according to claim 24, wherein said objective is telecentric on an object-side.

26. A projection objective according to one of claims 1 to 4, wherein a chief ray at an object runs to an optical axis.

27. A projection objective according to any one of claims 1 to 4, wherein one of the mirrors has a smallest focal length, and said smallest focal length mirror lies after an intermediate image.

28. A projection objective according to any one of claims 1 to 4, wherein a distance between the third mirror and the sixth mirror (S3S6) satisfies the following relationship:

0.3 (used diameter of S3+used diameter of S6)<S3S6.

29. A microlithography projection exposure apparatus with a projection objective according to any one of claims 1 to 4, comprising:
a reflection mask.

30. The microlithography projection exposure apparatus according to claim 29, further comprising an illumination system for illuminating an arc-shaped field.

31. A microlithography projection exposure apparatus with a projection objective according to any one of claims 1 to 4, comprising:
a transmission mask.

32. The microlithography projection exposure apparatus according to claim 31, further comprising an illumination system for illuminating an arc-shaped field.

33. The projection objective according to any one of claims 1 to 3 wherein said wavelength is below 100 mm.

34. The projection objective according to claim 1 wherein said image-side optical free working distance is 60 mm.

35. The projection objective of claim 20, wherein the imaging ratio is in the range, $0.5<\beta<-1.5$.

36. The projection objective of claim 21, wherein the imaging ratio is in the range, $-0.5>\beta>-1.0$.

37. The projection objective of claim 22, wherein the rms wave-front error is $0.03\lambda$.

38. The projection objective according to any one of claims 1 to 4 wherein said object to be illuminated is a wafer.

39. The projection objective according to claim 5 wherein said image-side optical free working distance is 60 mm.

* * * * *